United States Patent
Lin et al.

(10) Patent No.: US 8,535,969 B2
(45) Date of Patent: Sep. 17, 2013

(54) SOLAR CELL AND MANUFACTURING METHOD THEREOF

(75) Inventors: Chiung-Wei Lin, Taipei (TW); Yi-Liang Chen, Taipei (TW)

(73) Assignees: Tatung Company, Taipei (TW); Tatung University, Taipei (TW)

( * ) Notice: Subject to any disclaimer, the term of this patent is extended or adjusted under 35 U.S.C. 154(b) by 0 days.

(21) Appl. No.: 13/531,604

(22) Filed: Jun. 25, 2012

(65) Prior Publication Data

US 2012/0258568 A1 Oct. 11, 2012

Related U.S. Application Data

(62) Division of application No. 12/719,870, filed on Mar. 9, 2010, now Pat. No. 8,299,353.

(30) Foreign Application Priority Data

Jan. 11, 2010 (TW) ................................ 99100545 A

(51) Int. Cl.
  *H01L 21/00* (2006.01)
(52) U.S. Cl.
  USPC .............................................. 438/69; 438/98

(58) Field of Classification Search
  USPC ........................................... 438/69, 97–99, 57
  See application file for complete search history.

(56) References Cited

U.S. PATENT DOCUMENTS

2009/0223560 A1* 9/2009 Kim .............................. 136/256
2011/0220191 A1* 9/2011 Flood ........................... 136/255

* cited by examiner

*Primary Examiner* — Richard Booth
(74) *Attorney, Agent, or Firm* — Jianq Chyun IP Office

(57) ABSTRACT

A method for manufacturing a solar cell including a photovoltaic layer, a first electrode layer, a second electrode layer, an insulating layer and a light-transparent conductive layer is provided. The photovoltaic layer has a first surface and a second surface. The first electrode layer having at least one gap is disposed on the first surface, wherein the at least one gap exposes a portion of the photovoltaic layer. The second electrode layer is disposed on the second surface. The insulating layer having a plurality of pores is located on the photovoltaic layer exposed by the at least one gap, wherein the holes expose a portion of the photovoltaic layer. The light-transparent conductive layer covers the insulating layer and is connected with the first electrode layer. The transparent electrode is connected with the photovoltaic layer through at least a part of the pores.

11 Claims, 5 Drawing Sheets

SOLAR CELL AND MANUFACTURING METHOD THEREOF

CROSS-REFERENCE TO RELATED APPLICATION

This application is a Divisional of and claims the priority benefit of U.S. patent application Ser. No. 12/719,870, filed on Mar. 9, 2010, now pending, which claims the priority benefits of Taiwan application Serial No. 99100545, filed on Jan. 11, 2010. The entirety of each of the above-mentioned patent applications is hereby incorporated by reference herein and made a part of this specification.

BACKGROUND OF THE INVENTION

1. Field of the Invention

The present invention relates to a solar cell and a manufacturing method thereof. More particularly, the present invention relates to a solar cell with a better photoelectric conversion efficiency, and a manufacturing method thereof.

2. Description of Related Art

In recent years, an environmental protection consciousness is highly aroused. To resolve a problem of petroleum energy shortage, research of renewable energy is highlighted, in which solar cells become a focus of attention in development of the renewable energy.

In the solar cell, when sunlight irradiates a P-N diode, photons can enter the P-N diode to generate photocurrent, and the photocurrent is output by two electrodes of the P-N diode to generate voltage.

In a method for manufacturing a general solar cell, an N-type doped layer can be formed on a P-type silicon substrate through a deposition process, and then a front contact and a back contact can be formed at two sides of the P-type silicon substrate, wherein the front contact is defined as an electrode close to a light incident surface, and the back contact is defined as an electrode located apart from the light incident surface. Since the front contact is generally formed by a metal material, a part of the N-type doped layer is probably shielded by the opaque front contact, so that a photon absorption rate of the N-type doped layer is reduced. Moreover, a defect generated due to a contact between the metal material front contact and the N-type doped layer can probably lead to a merging phenomenon of electrons and holes passing through the contact area, so that an output of the photocurrent is limited.

Moreover, to ameliorate the light-shielding problem, the front contact is generally designed to be an interdigital structure with a narrow linewidth, though such structure design can lead to a problem of excessive series resistance, so that the output of the photocurrent is reduced. Therefore, a photoelectric conversion efficiency of the solar cell cannot be effectively improved according to the above design.

SUMMARY OF THE INVENTION

The present invention is directed to a solar cell, which has a better photoelectric conversion efficiency.

The present invention is directed to a method for manufacturing a solar cell, by which the aforementioned solar cell can be manufactured according to simple steps.

The present invention provides a solar cell including a photovoltaic layer, a first electrode layer, a second electrode layer, an insulating layer and a light-transparent conductive layer. The photovoltaic layer has a first surface and a second surface. The first electrode layer is disposed on the first surface of the photovoltaic layer, and has at least one gap, wherein the at least one gap exposes a portion of the photovoltaic layer. The second electrode layer is disposed on the second surface of the photovoltaic layer. The insulating layer having a plurality of pores is located on the photovoltaic layer exposed by the at least one gap, wherein the pores expose a portion of the photovoltaic layer. The light-transparent conductive layer covers the insulating layer and is connected to the first electrode layer. The light-transparent conductive layer is connected to the photovoltaic layer through at least a part of the pores.

In an embodiment of the present invention, the photovoltaic layer includes a P-type semiconductor layer and an N-type semiconductor layer.

In an embodiment of the present invention, materials of the first electrode layer and the second electrode layer include a metal material.

In an embodiment of the present invention, a material of the insulating layer includes a transparent material, and in an embodiment of the present invention, a material of the insulating layer includes silicon dioxide or silicon carbide.

In an embodiment of the present invention, the pores have irregular shapes, and in an embodiment of the present invention, diameters of the pores are substantially between 5 nm and 50 nm.

In an embodiment of the present invention, the pores are irregularly arranged.

In an embodiment of the present invention, the light-transparent conductive layer has a plurality of openings to expose a portion of the insulating layer.

In an embodiment of the present invention, the light-transparent conductive layer includes a plurality of nano wires.

The present invention provides a method for manufacturing a solar cell, which includes following steps. First, a photovoltaic layer is provided, wherein the photovoltaic layer has a first surface and a second surface. Next, an electrode material layer is formed on the first surface of the photovoltaic layer. Next, at least one gap is formed on the electrode material layer, wherein the at least one gap exposes a portion of the photovoltaic layer. Then, an electrode is formed on the second surface of the photovoltaic layer. Next, an insulating layer is formed on the photovoltaic layer exposed by the at least one gap, and a plurality of pores exposing a portion of the photovoltaic layer is formed on the insulating layer. Next, a light-transparent conductive layer is formed on the insulating layer, wherein the light-transparent conductive layer is connected to the first electrode layer, and is connected to the photovoltaic layer through at least a part of the pores.

In an embodiment of the present invention, a method of providing the photovoltaic layer includes following steps. First, a semiconductor substrate is provided. Next, an ion doping process or a deposition process is performed to the semiconductor substrate to form the photovoltaic layer, wherein the photovoltaic layer includes a first type semiconductor layer and a second type semiconductor layer, and a surface of the first type semiconductor layer is the first surface of the photovoltaic layer, and a surface of the second type semiconductor layer is the second surface of the photovoltaic layer. In an embodiment of the present invention, when the first type semiconductor layer is a P-type semiconductor layer, the second type semiconductor layer is an N-type semiconductor layer, and when the first type semiconductor layer is an N-type semiconductor layer, the second type semiconductor layer is a P-type semiconductor layer.

In an embodiment of the present invention, a method of forming the insulating layer includes a physical vapor fast deposition process or a chemical vapor fast deposition process.

In an embodiment of the present invention, a deposition rate for forming the insulating layer is substantially between 30 nm/min and 100 nm/min.

In an embodiment of the present invention, a method of forming the insulating layer includes performing a heat treatment process to the insulating layer containing hydrogen atoms, so as to release the hydrogen atoms from the insulating layer to form the pores.

In an embodiment of the present invention, a method of forming the insulating layer includes performing a plasma process to the insulating layer to form the pores on the insulating layer.

In an embodiment of the present invention, a method of forming the light-transparent conductive layer includes a chemical vapor deposition (CVD) process, a physical vapor deposition (PVD) process or a spin coating process.

In an embodiment of the present invention, the method for manufacturing the solar cell further includes forming a plurality of openings on the light-transparent conductive layer to expose a portion of the insulating layer.

In an embodiment of the present invention, when a material of the light-transparent conductive layer is a metal material, a thickness of the light-transparent conductive layer is substantially between 5 nm and 500 nm.

In an embodiment of the present invention, a material of the light-transparent conductive layer includes transparent conductive oxide.

According to the above descriptions, in the solar cell of the present invention, by forming the insulating layer having irregular pores between the light-transparent conductive layer and the photovoltaic layer, wherein the light-transparent conductive layer is connected to the photovoltaic layer through the pores, not only the electrons and holes in the gap that are located apart from the first electrode layer can be absorbed by the light-transparent conductive layer to increase a whole output of the photocurrent, but also a contact area between the light-transparent conductive layer and the photovoltaic layer can be reduced, so as to avoid a merging phenomenon of the electrons and the holes at the contact area between the light-transparent conductive layer and the photovoltaic layer, and avoid limiting the output of the photocurrent.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
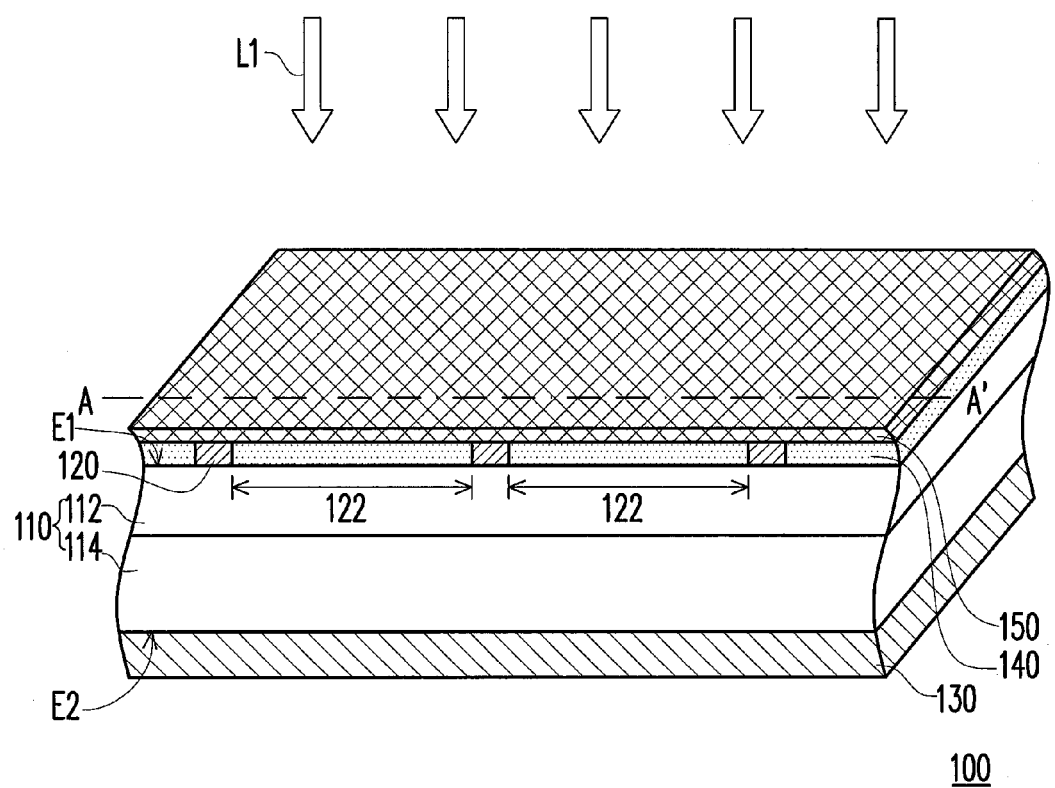
FIG. 1A is a partial schematic diagram illustrating a solar cell according to an embodiment of the present invention.
Figure 1B:
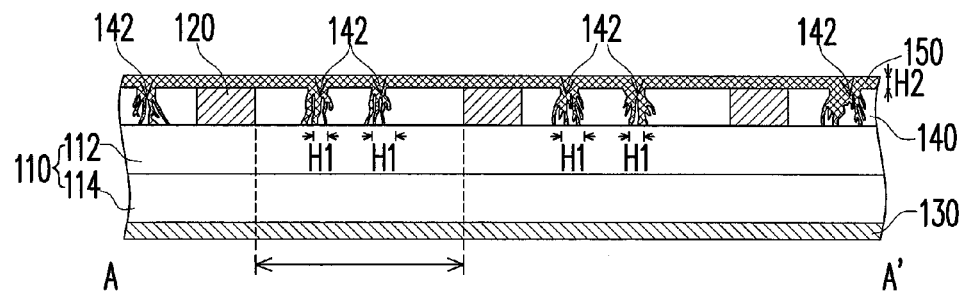
FIG. 1B is a cross-sectional view of a solar cell along an AA' line of FIG. 1A.
Figure 1C:
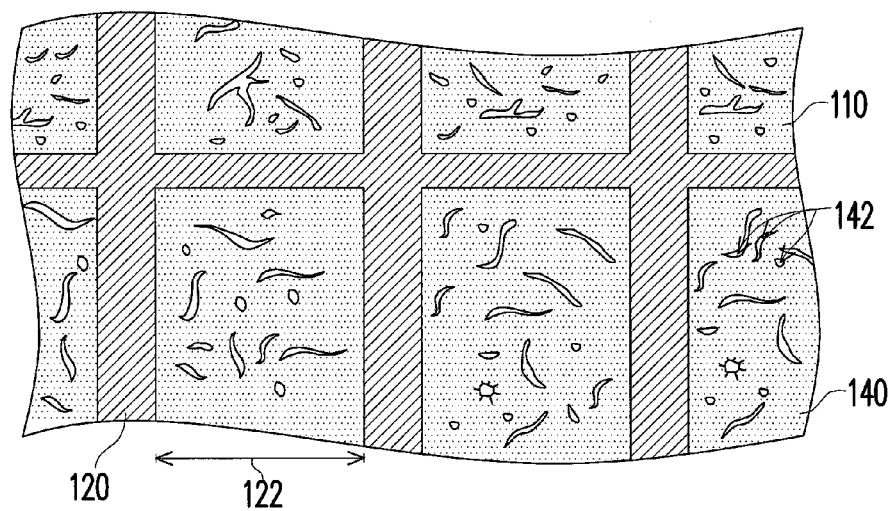
FIG. 1C is a top view of a solar cell of FIG. 1A.

FIG. 1A is a partial schematic diagram illustrating a solar cell according to an embodiment of the present invention, FIG. 1B is a cross-sectional view of the solar cell along an AA' line of FIG. 1A, and FIG. 1C is a top view of the solar cell of FIG. 1A, and for simplicity's sake, only a first electrode layer, an insulating layer and a photovoltaic layer of FIG. 1A are illustrated in FIG. 1C, and other possible film layers are neglected. Referring to FIGS. 1A, 1B and 1C, the solar cell 100 of the present embodiment includes a photovoltaic layer 110, a first electrode layer 120, a second electrode layer 130, an insulating layer 140 and a light-transparent conductive layer 150. The photovoltaic layer 110 has a first surface E1 and a second surface E2. The first electrode layer 120 is disposed on the first surface E1 of the photovoltaic layer 110, and the second electrode layer 130 is disposed on the second surface E2 of the photovoltaic layer 110. Generally, the first electrode layer 120 and the second electrode layer 130 respectively serve as a front contact and a back contact of the solar cell, wherein materials of the first electrode layer 120 and the second electrode layer 130 can be metals with good conductivities, such as gold, silver, copper, tin, lead, hafnium, tungsten, molybdenum, neodymium, titanium, tantalum, aluminum, and zinc, etc., or alloys thereof. Moreover, the materials of the first electrode layer 120 and the second electrode layer 130 can be the same or different, and in the present embodiment, the materials of the first electrode layer 120 and the second electrode layer 130 are assumed to be the same, though the present invention is not limited thereto.

In the present embodiment, the photovoltaic layer 110 includes a first type semiconductor layer 112 and a second type semiconductor layer 114, wherein a surface of the first type semiconductor layer 112 is the first surface E1 of the photovoltaic layer 110, and a surface of the second type semiconductor layer 114 is the second surface E2 of the photovoltaic layer 110. In the present embodiment, the first type semiconductor layer 112 can be a P-type semiconductor layer, and the second type semiconductor layer 114 can be an N-type semiconductor layer. In another embodiment, the first type semiconductor layer 112 can be an N-type semiconductor layer, and the second type semiconductor layer 114 can be a P-type semiconductor layer. In other words, the photovoltaic layer 110 is a P-N diode film layer structure. In this way, when light irradiates the photovoltaic layer 110, the photovoltaic layer 110 can absorb the light to generate electron-hole pairs.

In the present embodiment, the first surface E1 is defined to be a light incident surface, which means light L1 is suitable for entering the solar cell 100 from the first surface E1. In detail, when the light L1 (for example, the sunlight) irradiates the solar cell 100 from the top, as that shown in FIG. 1A and FIG. 1B, the light L1 sequentially passes through the light-transparent conductive layer 150 and the insulating layer 140, and reaches the photovoltaic layer 110, wherein the photovoltaic layer 110 is suitable for absorbing the light L1 to generate the electron-hole pairs. Then, the generated electron-hole pairs are influenced by an in-built electric field formed by the P-type semiconductor layer and the N-type semiconductor layer, and respectively move towards the first electrode layer 120 and the second electrode layer 130 to form a photocurrent. Now, if a load circuit or an electronic device is connected to the first electrode layer 120 and the second electrode layer 130, the generated photocurrent can drive the load circuit or the electronic device.

It should be noticed that since the first surface E1 is defined as the light incident surface, if the material of the first electrode layer 120 disposed on the first surface E1 is the metal material such as gold, silver, copper, tin, lead, etc., the light L1 probably cannot penetrate through the first electrode layer 120. Therefore, the first electrode layer 120 has at least one gap 122 for exposing a portion of the photovoltaic layer 110. For example, the first electrode layer 120 can be designed as an interdigital electrode shown as FIG. 1C, though the present invention is not limited thereto, and in other embodiments, the first electrode layer 120 can also be designed into other electrode patterns having the gaps 122 of different shapes according to actual demands of the user. In this way, the light L1 can be transmitted to the photovoltaic layer 110 through the gap 122.

Moreover, the first electrode layer 120 having the gap 122 can be formed through a conventional lithography etching process or a screen printing process. For example, an electrode material layer (not shown) is integrally formed on the first surface E1 first, and then a patterning process is performed to the electrode material layer to form the first electrode layer 120, wherein the first electrode layer 120 has at least one gap 122 for exposing a portion of the photovoltaic layer 110. Alternatively, the screen printing process can be performed to directly form the first electrode layer 120 having at least one gap 122 exposing a portion of the photovoltaic layer 110.

Referring to FIGS. 1A-1C, the insulating layer 140 is disposed on the photovoltaic layer 110 exposed by the at least one gap 122, and has a plurality of pores 142, wherein the pores 142 expose a portion of the photovoltaic layer 110. In the present embodiment, a material of the insulating layer 140 can be a transparent material, so that when the light L1 is transmitted to the gap 122, the light L1 can pass through the insulating layer 140 and reach the photovoltaic layer 110. In the present embodiment, the material of the transparent insulating layer 140 can be an organic material or an inorganic material, wherein the inorganic material includes silicon oxide, silicon nitride, silicon oxynitride, silicon carbide, hafnium oxide, and aluminum oxide, and combinations thereof, and the organic material includes photoresist, benzocyclobutene, cycloalkenes, polyimides, polyamides, polyesters, polyalcohols, polyethylene oxides, polyphenylenes, resins, polyethers, polyketide, and combinations thereof. In the present embodiment, the material of the insulating layer 140 is, for example, the silicon dioxide or silicon carbide, though the present invention is not limited thereto.

Moreover, the light-transparent conductive layer 150 covers the insulating layer 140 and is connected to the first electrode layer 120, and the light-transparent conductive layer 150 is connected to the photovoltaic layer 110 through at least a part of the pores 142, as that shown in FIG. 1B. In the present embodiment, since the light-transparent conductive layer 150 can be connected to the photovoltaic layer 110 through the pores 142, besides that the electrons or the holes generated by the photovoltaic layer 110 can be directly transmitted to the first electrode layer 120, the electrons or the holes located in the gap 122 that are not easy to be transmitted to the first electrode layer 120 can be transmitted to the light-transparent conductive layer 150, and then transmitted to the first electrode layer 120. In this way, an electric performance of the solar cell 100 can be improved.

In detail, since the first electrode layer 120 has the gap 122 exposing a portion of the photovoltaic layer 110, when the photovoltaic layer 110 is irradiated by light to generate the electron-hole pairs, the electrons or the holes in the gap 122 that are located apart from the first electrode layer 120 are not easy to be transmitted to the first electrode layer 120 since the electrons and the holes are probably merged in the photovoltaic layer 110 before spreading to the first electrode layer 120, so that the electric performance of the solar cell 100 is decreased. Therefore, in the solar cell 100 of the present embodiment, the insulating layer 140 having a plurality of nano-level pores 142 is disposed on the photovoltaic layer 110, and the light-transparent conductive layer 150 is disposed on the insulating layer 140, wherein the light-transparent conductive layer 150 is connected to the first electrode layer 120, and is connected to the photovoltaic layer 110 through the pores 142. Therefore, the electrons or the holes in the gap 122 that are located apart from the first electrode layer 120 can spread to the light-transparent conductive layer 150, so that a usage rate of the electrons and holes of the solar cell 100 is improved.

Moreover, when a material of the light-transparent conductive layer 150 is a metal material, a thickness H2 of the light-transparent conductive layer 150 is substantially between 5 nm and 500 nm, so that the light L1 is suitable for passing through the light-transparent conductive layer 150 to reach the photovoltaic layer 110. To achieve a better transmittance of the light-transparent conductive layer 150 for increasing a photoelectric conversion efficiency of the solar cell 100, the thickness H2 of the light-transparent conductive layer 150 is preferably between 5 nm and 50 nm.

In an embodiment, to further increase a light intensity of the light L1 transmitted to the photovoltaic layer 110, the light-transparent conductive layer 150 can further have a plurality of openings (not shown) for exposing a portion of the insulating layer 140. In this way, the light L1 can directly pass through the insulating layer 140 via the openings to reach the photovoltaic layer 110, so as to avoid a part of the light L1 being absorbed or reflected by the light-transparent conductive layer 150. In other words, if the light-transparent conductive layer 150 has the openings exposing a portion of the insulating layer 140, a chance for the light L1 entering the photovoltaic layer 110 and a light intensity thereof are increased, so that the whole photoelectric conversion efficiency of the solar cell 100 can be improved.

In another embodiment, besides the metal material, the light-transparent conductive layer 150 can also be made of transparent conductive oxide such as indium-tin oxide, indium-zinc oxide, indium-tin-zinc oxide, hafnium oxide, zinc oxide, aluminum oxide, aluminum-tin oxide, aluminum-zinc oxide, cadmium-tin oxide, cadmium-zinc oxide or combinations thereof. Now, the light-transparent conductive layer 150 does not have the openings exposing a portion of the insulating layer 140.

Figure 2A:
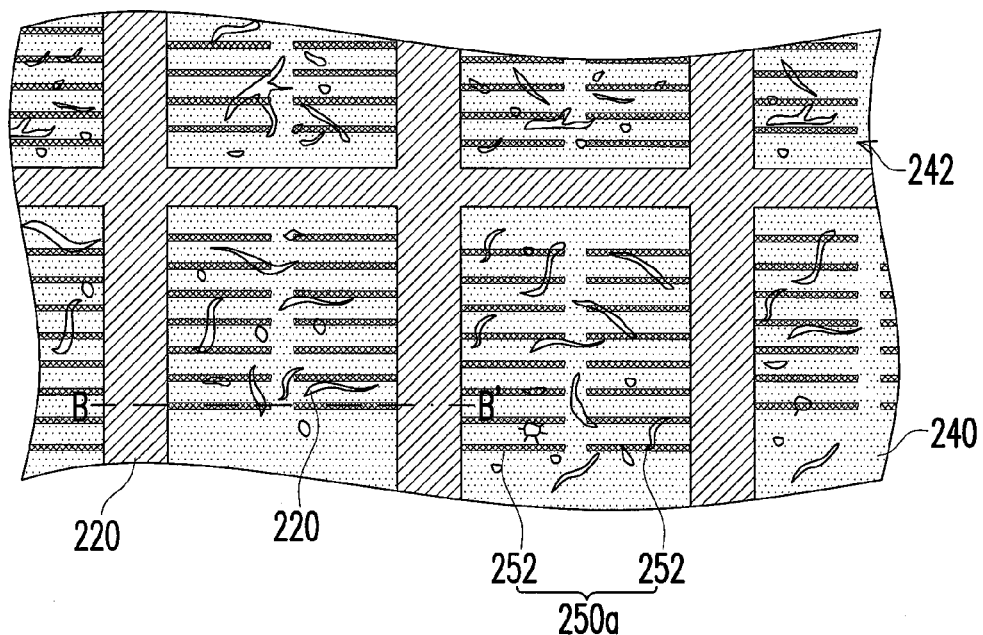
FIG. 2A is a top view of a solar cell according to another embodiment of the present invention.
Figure 2B:
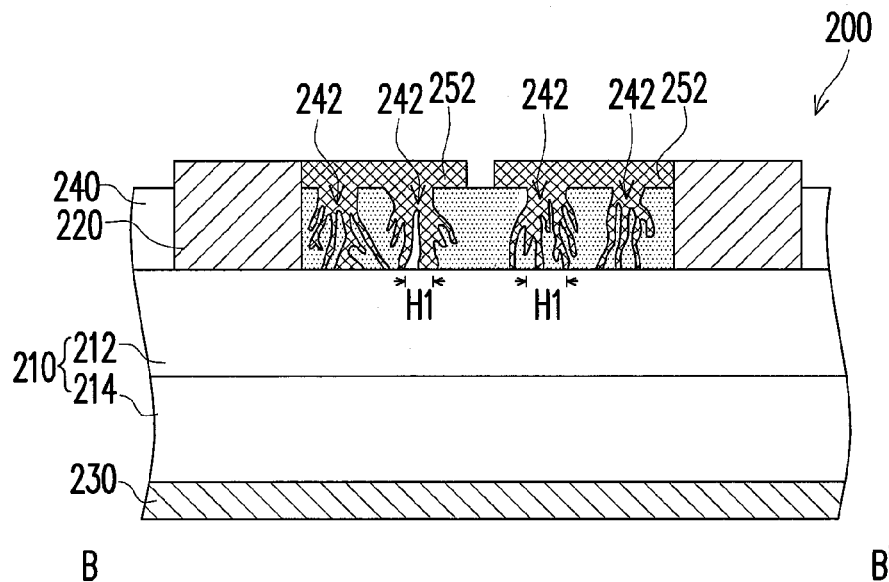
FIG. 2B is a cross-sectional view of a solar cell along a BB' line of FIG. 2A.

In another embodiment, the light-transparent conductive layer 150 may have a design of a plurality of nano wires to form another solar cell structure 200, as that shown in FIG. 2A and FIG. 2B. FIG. 2A is a top view of a solar cell according to another embodiment of the present invention, and FIG. 2B is a cross-sectional view of the solar cell along a BB' line of FIG. 2A. Similarly, for simplicity's sake, only a first electrode layer, an insulating layer, a light-transparent conductive layer and a photovoltaic layer are illustrated in the solar cell of FIG. 2A, and other possible film layers are neglected.

Referring to FIG. 2A and FIG. 2B, in the solar cell 200, a light-transparent conductive layer 250a is formed by a plurality of nano wires 252, wherein the nano wires 252 are connected to a first electrode layer 220, and the nano wires 252 are disposed on an insulating layer 240 and are connected to a photovoltaic layer 210 through pores 242. It should be noticed that the nano wires 252 illustrated in FIG. 2A are straight lines, though in an actual application, the nano wires 252 generally have irregular patterns, and the nano wires 252 illustrated in FIG. 2A are only used as an example, which is not used to limit the present invention.

Referring to FIGS. 1B and 2B, in the solar cell 100 and the solar cell 200, the light-transparent conductive layers 150 and 250a are respectively disposed on the insulating layers 140 and 240, and are respectively connected to the first electrode layers 120 and 220, and the pores 142 and 242 of the insulating layers 140 and 240 have irregular shapes, wherein diameters H1 of the pores 140 and 240 are substantially between 5 nm and 50 nm. In this way, contact areas respectively between the light-transparent conductive layers 150 and 250a and the photovoltaic layers 110 and 210 can be reduced to avoid excessive electrons or holes being absorbed at the contact areas respectively between the light-transparent conductive layers 150 and 250a and the photovoltaic layers 110 and 210. In detail, since materials of the light-transparent conductive layers 150 and 250a and the photovoltaic layers 110 and 210 are respectively conductors and semiconductors, the contact area there between may have defects. Therefore, when the electrons or the holes pass through the contact area, the electrons and the holes are probably merged due to the defects, so that the electric performance of the solar cell is reduced. Therefore, in the present embodiment, the insulating layers 140 and 240 having a plurality of nano-level pores 142 and 242 are respectively configured, so that the light-transparent conductive layers 150 and 250a respectively disposed on the insulating layers 140 and 240 can be connected to the photovoltaic layers 110 and 210 through the pores 142 and 242. In the present embodiment, the pores 142 and 242 are irregularly arranged, as that shown in FIG. 1C and FIG. 2A.

In an embodiment, when the insulating layers 140 and 240 are fabricated, the pores 142 and 242 can be simultaneously formed thereon, wherein the pores 140 and 242 respectively expose a portion of the photovoltaic layers 110 and 210. In this way, after the light-transparent conductive layers 150 and 250a are disposed on the insulating layers 140 and 240, and are respectively connected to the first electrode layer 120 and 220, the light-transparent conductive layers 150 and 250a can infiltrate the pores 142 and 242 of the insulating layers 140 and 240 to electrically connect the photovoltaic layers 110 and 210 exposed by the pores 142 and 242. Therefore, the electrons and the holes generated by the photovoltaic layers 110 and 210 can also be transmitted by the light-transparent conductive layers 150 and 250a, so that transmission paths of the electrons and the holes are increased. Therefore, the electrons and the holes can be absorbed by the light-transparent conductive layers 150 and 250a before the electrons and the holes are merged, so that the electric performance of the solar cells 100 and 200 are improved. Moreover, since the insulating layers 140 and 240 respectively isolate a portion of the light-transparent conductive layers 150 and 250a and the photovoltaic layers 110 and 210, merging of the electrons and the holes occurred at the contact areas respectively between the light-transparent conductive layers 150 and 250a and the photovoltaic layers 110 and 210 can be mitigated.

Moreover, the present invention also provides a method for manufacturing the aforementioned solar cells, as that shown in FIGS. 3A-3E, and FIGS. 3A-3E are schematic diagrams illustrating a manufacturing process of the solar cell of FIG. 1B.

Figure 3A:
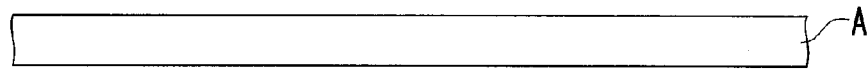
FIGS. 3A-3E are schematic diagrams illustrating a manufacturing process of a solar cell of FIG. 1B.

Referring to FIG. 3A, first, a semiconductor substrate A is provided. In the present embodiment, the semiconductor substrate A is, for example, a P-type doped silicon chip, though the present invention is not limited thereto.

Figure 3B:
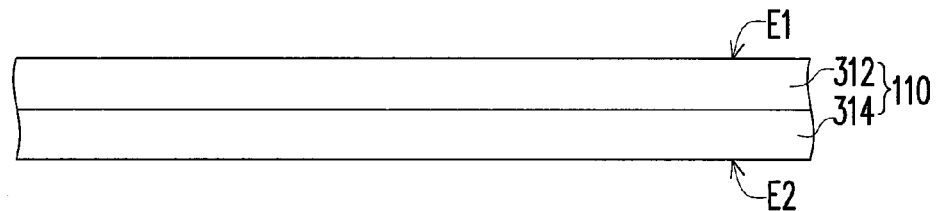

Then, an ion doping process or a deposition process is performed to the semiconductor substrate A to form a photovoltaic layer 310, as that shown in FIG. 3B, wherein the photovoltaic layer 310 includes a first type semiconductor layer 312 and a second type semiconductor layer 314. In the present embodiment, when the first type semiconductor layer 312 is an N-type semiconductor layer, the second type semiconductor layer 314 is a P-type semiconductor layer. In another embodiment, if the semiconductor substrate A is an N-type doped silicon chip, when the first type semiconductor layer 312 is a P-type semiconductor layer, the second type semiconductor layer 314 is an N-type semiconductor layer.

Figure 3C:
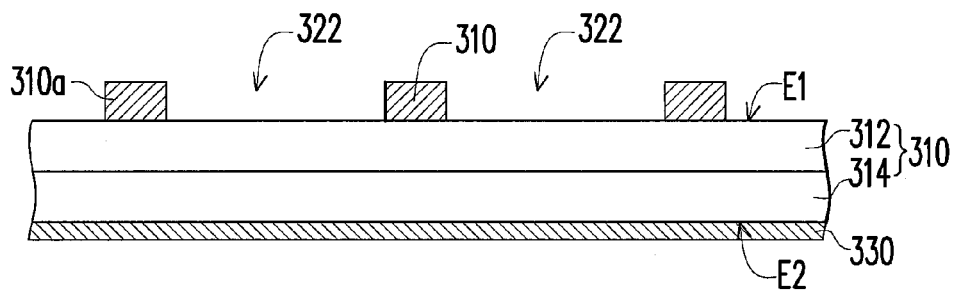

Then, an electrode material layer 310a is formed on the first surface E1 of the photovoltaic layer 310, and gaps 322 are formed on the electrode material layer 310a, wherein the gaps expose a portion of the photovoltaic layer 310, as that shown in FIG. 3C. In the present embodiment, the electrode material layer 310 is formed according to, for example, a chemical vapor deposition (CVD) process, a physical vapor deposition (PVD) process or a spin coating process, wherein the PVD process can be sputtering or evaporation. Moreover, a conventional lithography etching process can be applied to pattern the electrode material layer 310a to form the gaps 322 shown in FIG. 3C. Alternatively, a screen printing process can be performed to directly form the first electrode layer 320 (310a) having at least one gap 322 exposing a portion of the photovoltaic layer 310.

Then, referring to FIG. 3C again, a second electrode layer 330 is formed on the second surface E2 of the photovoltaic layer 310. In the present embodiment, a method of forming the second electrode layer 330 (310a) is, for example, the same to the method of forming the aforementioned electrode material layer 130, though materials thereof can be the same or different.

Figure 3D:
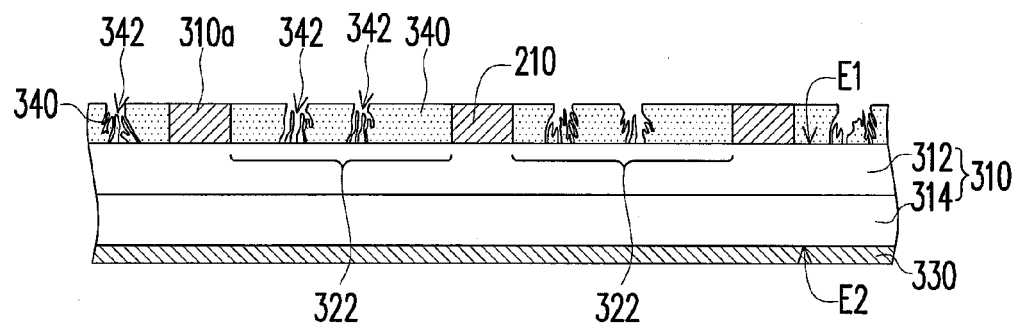

Next, an insulating layer 340 is formed on the photovoltaic layer 310 exposed by the gaps 322, and a plurality of pores 342 are formed on the insulating layer 340, as that shown in FIG. 3D. In the present embodiment, the insulating layer 340 can be formed according to a physical vapor fast deposition process or a chemical vapor fast deposition process, so that during the process of forming the insulating layer 340, the irregularly arranged pores 342 with irregular shapes are formed due to a fast deposition rate, wherein the deposition rate for forming the insulating layer 340 is substantially between 30 nm/min and 100 nm/min. In an embodiment, a fast bake process can be performed to the insulating layer 340 containing hydrogen atoms, so as to release the hydrogen atoms from the insulating layer 340 to produce cracks in the insulating layer 340, and accordingly form the irregularly arranged pores 342 with irregular shapes in the insulating layer 340.

In another embodiment, regarding a method of forming the insulating layer 340, ions can be used to impact a surface of the insulating layer 340, so as to form the irregularly arranged pores 342 with irregular shapes. Alternatively, in a further embodiment, the insulating layer 340 can also be formed through a fast coating process, so that during the process of forming the insulating layer 340, the irregularly arranged pores 342 with irregular shapes can be produced due to a fast coating rate.

Figure 3E:
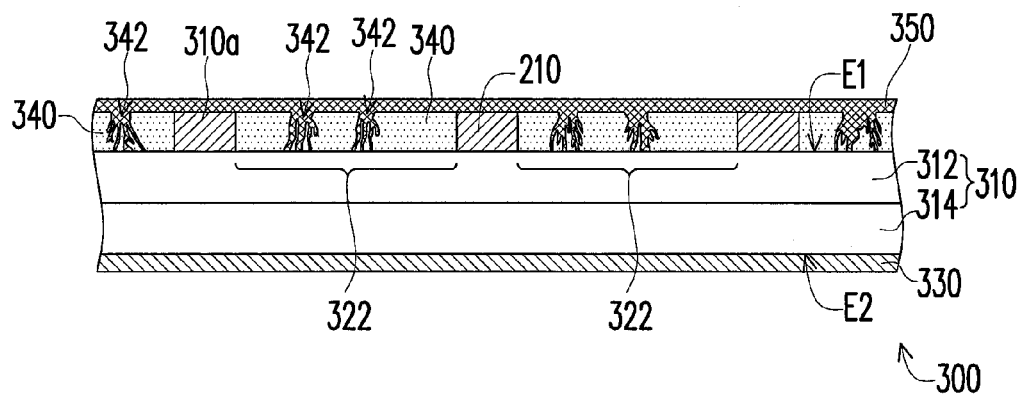

After the insulating layer 340 having the pores 342 is formed, a light-transparent conductive layer 350 is formed on the insulating layer 340, wherein the light-transparent conductive layer 350 is electrically connected to the electrode material layer 310a, and is connected to the photovoltaic layer 310 through at least a part of the pores 342, as that shown in FIG. 3E. In the present embodiment, the light-transparent conductive layer 350 is formed according to, for example, a chemical vapor deposition (CVD) process, a physical vapor deposition (PVD) process or a spin coating process, wherein the PVD process can be sputtering or evaporation. If a material of the light-transparent conductive layer 350 is a metal material, a thickness of the light-transparent conductive layer 350 is controlled to be 50 nm-500 nm, so that the metal material light-transparent conductive layer 350 can be transparent. In an embodiment, the material of the light-transparent conductive layer 350 can also be the aforementioned transparent conductive oxide material. By completing the above processes, the method of manufacturing the solar cell 300 is approximately completed.

In summary, the solar cell of the present invention and the method for manufacturing the same has at least following advantages. First, by fabricating the insulating layer having irregular pores between the light-transparent conductive layer and the photovoltaic layer, wherein the light-transparent conductive layer is connected to the photovoltaic layer through the pores, not only the electrons or the holes in the gaps that are located apart from the first electrode layer can be absorbed by the light-transparent conductive layer to increase a whole output of the photocurrent, but also a contact area between the light-transparent conductive layer and the photovoltaic layer can be reduced, so as to avoid a merging phenomenon of the electrons and the holes at the contact area between the light-transparent conductive layer and the photovoltaic layer, and avoid limiting the output of the photocurrent. Moreover, if the material of the light-transparent conductive layer is a metal material, the thickness of the light-transparent conductive layer can be suitably controlled to achieve the transparent effect, so that the light can enter the photovoltaic layer, and the solar cell can provide the photocurrent. In addition, during the process of forming the insulating layer, the pores can be simultaneously formed thereon due to a fast deposition rate or a fast spin coating rate, or ions can be used to impact the insulating layer or a heat treatment process can be performed to form the pores.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a solar cell, comprising:
providing a photovoltaic layer, wherein the photovoltaic layer has a first surface and a second surface;
forming an electrode material layer on the first surface of the photovoltaic layer;
forming at least one gap on the electrode material layer, wherein the at least one gap exposes a portion of the photovoltaic layer;
forming an electrode on the second surface of the photovoltaic layer;
forming an insulating layer on the photovoltaic layer exposed by the at least one gap, and forming a plurality of pores exposing a portion of the photovoltaic layer on the insulating layer; and
forming a light-transparent conductive layer on the insulating layer, wherein the light-transparent conductive layer is connected to the first electrode layer, and is connected to the photovoltaic layer through at least a part of the pores.

2. The method for manufacturing the solar cell as claimed in claim 1, wherein a method of providing the photovoltaic layer comprises:
providing a semiconductor substrate;
performing an ion doping process or a deposition process to the semiconductor substrate to form the photovoltaic layer, wherein the photovoltaic layer comprises a first type semiconductor layer and a second type semiconductor layer, and a surface of the first type semiconductor layer is the first surface of the photovoltaic layer, and a surface of the second type semiconductor layer is the second surface of the photovoltaic layer.

3. The method for manufacturing the solar cell as claimed in claim 2, wherein when the first type semiconductor layer is a P-type semiconductor layer, the second type semiconductor layer is an N-type semiconductor layer, and when the first type semiconductor layer is an N-type semiconductor layer, the second type semiconductor layer is a P-type semiconductor layer.

4. The method for manufacturing the solar cell as claimed in claim 1, wherein a method of forming the insulating layer comprises a physical vapor fast deposition process or a chemical vapor fast deposition process.

5. The method for manufacturing the solar cell as claimed in claim 4, wherein a deposition rate for forming the insulating layer is substantially between 30 nm/min and 100 nm/min.

6. The method for manufacturing the solar cell as claimed in claim 1, wherein a method of forming the insulating layer comprises performing a heat treatment process to the insulating layer containing hydrogen atoms, so as to release the hydrogen atoms from the insulating layer to form the pores.

7. The method for manufacturing the solar cell as claimed in claim 1, wherein a method of forming the insulating layer comprises performing a plasma process to the insulating layer to form the pores on the insulating layer.

8. The method for manufacturing the solar cell as claimed in claim 1, wherein a method of forming the light-transparent conductive layer comprises a chemical vapor deposition (CVD) process or a physical vapor deposition (PVD) process.

9. The method for manufacturing the solar cell as claimed in claim 1, wherein when a material of the light-transparent conductive layer is a metal material, a thickness of the light-transparent conductive layer is substantially between 5 nm and 500 nm.

10. The method for manufacturing the solar cell as claimed in claim 9, further comprising forming a plurality of openings on the light-transparent conductive layer to expose a portion of the insulating layer.

11. The method for manufacturing the solar cell as claimed in claim 1, wherein a material of the light-transparent conductive layer comprises transparent conductive oxide.

* * * * *